(12) United States Patent
Huang

(10) Patent No.: US 12,113,073 B2
(45) Date of Patent: Oct. 8, 2024

(54) ARRAY SUBSTRATE, MANUFACTURING METHOD THEREOF AND DISPLAY PANEL

(71) Applicants: HUIZHOU CHINA STAR OPTOELECTRONICS DISPLAY CO., LTD., Guangdong (CN); TCL CHINA STAR OPTOELECTRONICS TECHNOLOGY CO., LTD., Guangdong (CN)

(72) Inventor: Xu Huang, Guangdong (CN)

(73) Assignees: HUIZHOU CHINA STAR OPTOELECTRONICS DISPLAY CO., LTD., Guangdong (CN); TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,488

(22) PCT Filed: Nov. 25, 2021

(86) PCT No.: PCT/CN2021/133284
§ 371 (c)(1),
(2) Date: Dec. 12, 2021

(87) PCT Pub. No.: WO2023/082349
PCT Pub. Date: May 19, 2023

(65) Prior Publication Data
US 2024/0014217 A1 Jan. 11, 2024

(30) Foreign Application Priority Data

Nov. 12, 2021 (CN) .......................... 202111341348.3

(51) Int. Cl.
H01L 27/12 (2006.01)

(52) U.S. Cl.
CPC ........ *H01L 27/1225* (2013.01); *H01L 27/127* (2013.01)

(58) Field of Classification Search
CPC .................. H01L 27/1225; H01L 27/127; H01L 27/1222
See application file for complete search history.

(56) References Cited

U.S. PATENT DOCUMENTS

2017/0309649 A1  10/2017 Hayashi
2019/0062900 A1*  2/2019 Nakayama ........ H01L 21/02631
(Continued)

FOREIGN PATENT DOCUMENTS

CN          105103299 A    11/2015
CN          106158978 A    11/2016
(Continued)

OTHER PUBLICATIONS

International Search Report in International application No. PCT/CN2021/133284, mailed on Jun. 24, 2022.
(Continued)

*Primary Examiner* — J. E. Schoenholtz
*Assistant Examiner* — Joe Schoenholtz
(74) *Attorney, Agent, or Firm* — PV IP PC; Wei Te Chung

(57) ABSTRACT

Provided are an array substrate, a manufacturing method thereof and a display panel; the array substrate includes a thin film transistors disposed on a base substrate, and a conductive channel of the thin film transistor is formed on a contact surface of the first semiconductor layer and the second semiconductor layer. It can avoid the interface defect state caused by the material difference when the existing conductive channel is formed on the side of the semiconductor layer close to the insulating layer, thereby solving the problem of poor lighting stability in the existing oxide semiconductor thin film transistor.

18 Claims, 5 Drawing Sheets

(56) References Cited

U.S. PATENT DOCUMENTS

| | | | | |
|---|---|---|---|---|
| 2021/0265506 A1* | 8/2021 | Sohn | ................. | H01L 29/66969 |
| 2021/0280719 A1 | 9/2021 | Kim | | |
| 2021/0384357 A1* | 12/2021 | Park | ................... | H01L 27/1225 |
| 2023/0146562 A1* | 5/2023 | Lee | ................... | H10K 59/1213 |
| | | | | 257/40 |
| 2023/0207702 A1* | 6/2023 | Park | ................. | H01L 29/78633 |
| | | | | 257/43 |

FOREIGN PATENT DOCUMENTS

| | | |
|---|---|---|
| CN | 107123671 A | 9/2017 |
| CN | 112992921 A | 6/2021 |

OTHER PUBLICATIONS

Written Opinion of the International Search Authority in International application No. PCT/CN2021/133284, mailed on Jun. 24, 2022.

\* cited by examiner

ARRAY SUBSTRATE, MANUFACTURING METHOD THEREOF AND DISPLAY PANEL

FIELD OF THE INVENTION

The present application relates to a display technology field, and more particularly to an array substrate, a manufacturing method thereof and a display panel.

BACKGROUND OF THE INVENTION

In the active matrix display technology, each sub pixel is driven by a thin film transistor (TFT) integrated on it, so that a high-speed, high-brightness and high-contrast screen display effect can be achieved. Thin film transistors are mainly classified into amorphous silicon (a-Si) thin film transistors, low temperature poly-silicon (LTPS) thin film transistors and oxide semiconductor thin film transistors according to the material of the semiconductor layer. Oxide semiconductor thin film transistor (Oxide TFT) has been widely used due to its simple process compared with low-temperature polysilicon thin film transistors and higher compatibility with amorphous silicon thin film transistors. However, compared with traditional amorphous silicon semiconductor materials, there are more defects at the interface between the metal oxide and the gate insulating layer, which leads to problems such as poor lighting stability.

SUMMARY OF THE INVENTION

The present application provides an array substrate, a manufacturing method thereof and a display panel, to alleviate the technical problem of poor lighting stability in the existing oxide semiconductor thin film transistors.

To solve the aforesaid problem, the technical solution of the present application is described as follows:

the embodiment of the present application provides an array substrate, comprising a base substrate and a thin film transistor disposed on the base substrate, and the thin film transistor comprises a first gate, a first semiconductor layer, a second semiconductor layer, a second gate, a source electrode and a drain electrode which are sequentially disposed on the base substrate, wherein a conductive channel of the thin film transistor is formed on a contact surface of the first semiconductor layer and the second semiconductor layer.

In the array substrate provided by the embodiment of the present application, a carrier concentration of the first semiconductor layer is greater than a carrier concentration of the second semiconductor layer.

In the array substrate provided by the embodiment of the present application, materials of the first semiconductor layer and the second semiconductor layer comprise indium gallium zinc oxide.

In the array substrate provided by the embodiment of the present application, a content of gallium in the first semiconductor layer is less than a content of gallium in the second semiconductor layer.

In the array substrate provided by the embodiment of the present application, both the first gate and the second gate are connected to a negative voltage.

The array substrate provided by the embodiment of the present application further comprises:

a first gate insulating layer, covering the first gate and the base substrate, and the first semiconductor layer is disposed on the first insulating layer and the second semiconductor layer is disposed on the first semiconductor layer, and an orthographic projection of the second semiconductor layer on the base substrate is within an orthographic projection of the first semiconductor layer on the base substrate;

a second gate insulating layer, covering the second semiconductor layer, and the second gate is disposed on the second insulating layer, and the second gate is disposed corresponding to the conductive channel;

an interlayer insulating layer, covering the second gate and the first gate insulating layer, and the source electrode and the drain electrode are disposed on the interlayer insulating layer, and a plurality of first via holes are disposed in the interlayer insulating layer;

wherein the first semiconductor layers located on both sides of the conductive channel form a source region and a drain region of the thin film transistor, and the source electrode and the drain electrode are respectively connected to the source region and the drain region through the corresponding first via holes.

In the array substrate provided by the embodiment of the present application, the thin film transistor further comprises a bridge electrode, and the second gate is electrically connected to the first gate through the bridge electrode.

In the array substrate provided by the embodiment of the present application, the bridge electrode and the source electrode are disposed in a same layer, and the interlayer insulating layer is further disposed with a second via hole and a third via hole, and the bridge electrode is connected to the second gate through the second via hole, and is connected to the first gate through the third via hole.

In the array substrate provided by the embodiment of the present application, the orthographic projection of the first semiconductor layer on the base substrate is within an orthographic projection of the first gate on the base substrate.

In the array substrate provided by the embodiment of the present application, a length of the second semiconductor layer is smaller than a length of the first semiconductor layer.

The embodiment of the present application further provides a display panel comprising the array substrate of one of the foregoing embodiments.

The embodiment of the present application provides a manufacturing method of an array substrate, comprising a step of providing a base substrate, and a step of manufacturing a thin film transistor on the base substrate, wherein the step of manufacturing the thin film transistor comprises:

preparing a first gate on the base substrate;

preparing a first gate insulating layer on the first gate and the base substrate, and preparing a first semiconductor layer on the first gate insulating layer;

preparing a second semiconductor layer on the first semiconductor layer;

preparing a second gate insulating layer on the second semiconductor layer and preparing a second gate on the second gate insulating layer, and employing the second gate as a shield to etch the second gate insulating layer and the second semiconductor layer to expose part of the first semiconductor layer, wherein a conductive channel of the thin film transistor is formed on a contact surface of the first semiconductor layer and the second semiconductor layer, and the first semiconductor layers located on both sides of the conductive channel form a source region and a drain region of the thin film transistor;

preparing an interlayer insulating layer on the second gate and the first gate insulating layer, and patterning the interlayer insulating layer to form a plurality of first via holes and preparing a source electrode and a drain electrode on the interlayer insulating layer, and the source electrode and the drain electrode are respectively connected to the source region and the drain region through the corresponding first via holes.

In manufacturing method of the array substrate provided by the embodiment of the present application, the step of preparing the first semiconductor layer on the first gate insulating layer comprises:

implementing a magnetron sputtering method to sputter an indium gallium zinc oxide target material with a gallium content of a first preset value on the first gate insulating layer to form the first semiconductor layer in an atmosphere of a first preset O2/Ar ratio.

In manufacturing method of the array substrate provided by the embodiment of the present application, the step of preparing the second semiconductor layer on the first semiconductor layer comprises:

implementing a magnetron sputtering method to sputter an indium gallium zinc oxide target material with a gallium content of a second preset value on the first semiconductor layer to form the second semiconductor layer in an atmosphere of a second preset O2/Ar ratio, wherein a value of the second preset O2/Ar ratio is greater than a value of the first preset O2/Ar ratio and the second preset value is greater than the first preset value, so that a carrier concentration of the first semiconductor layer is greater than a carrier concentration of the second semiconductor layer.

In manufacturing method of the array substrate provided by the embodiment of the present application, the manufacturing method further comprises:

the step of patterning the interlayer insulating layer further forms a second via hole and a third via hole, and while forming the source electrode and the drain electrode on the interlayer insulating layer, a bridge electrode is further formed, and the bridge electrode is connected to the second gate through the second via hole, and is connected to the first gate through the third via hole, so that both the first gate and the second gate are connected to a negative voltage.

In the array substrate, the manufacturing method thereof and the display panel provided by the present application, the array substrate comprises a base substrate and a thin film transistor disposed on the base substrate, and the thin film transistor comprises a first gate, a first semiconductor layer, a second semiconductor layer, a second gate, a source electrode and a drain electrode which are sequentially disposed on the base substrate, wherein a conductive channel of the thin film transistor is formed on a contact surface of the first semiconductor layer and the second semiconductor layer. In the present application, the conductive channel is formed between semiconductor layers of the same material. It can avoid the interface defect state caused by the material difference when the existing conductive channel is formed on the side of the semiconductor layer close to the insulating layer, thereby solving the problem of poor lighting stability in the existing oxide semiconductor thin film transistor.

BRIEF DESCRIPTION OF THE DRAWINGS

In order to more clearly illustrate the embodiments of the present invention and the prior art, the following figures will be described in the embodiments and the prior art are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
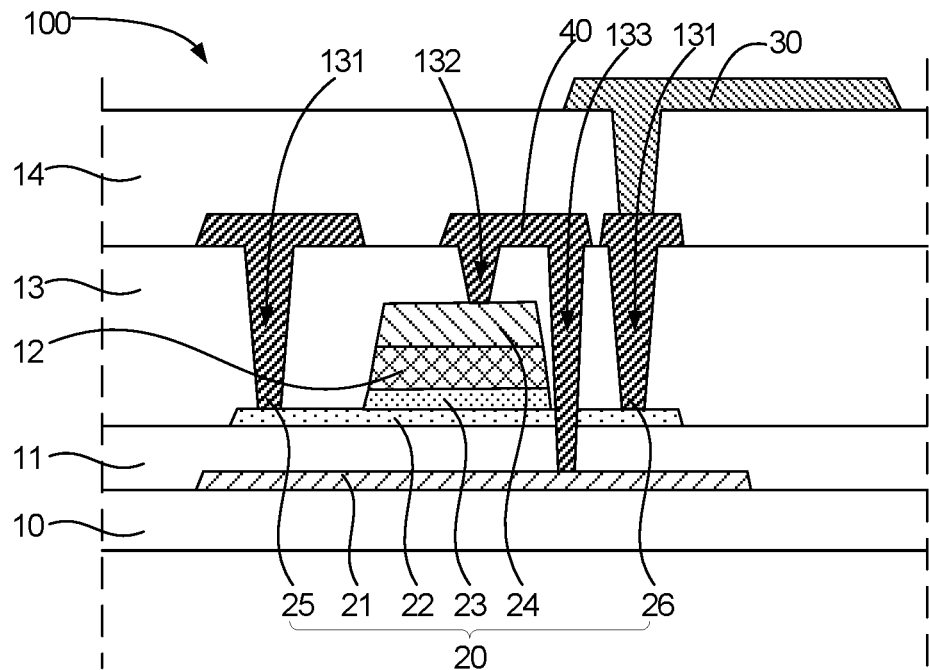
FIG. 1 is a diagram of a cross-sectional structure of an array substrate provided by an embodiment of the present application.

The following descriptions for the respective embodiments are specific embodiments capable of being implemented for illustrations of the present application with referring to appended figures. The terms of up, down, front, rear, left, right, interior, exterior, side, etcetera mentioned in the present application are merely directions of referring to appended figures. Thus, the used directional terms are used to describe and understand the present application, but the present invention is not limited thereto. In the figure, units with similar structures are denoted by the same reference numerals. In the figures, for clear understanding and convenient describing, the thickness of some layers and regions are exaggerated. That is, the size and thickness of each component shown in the figures are arbitrarily shown, but the application is not limited thereto.

In view of the poor lighting stability of the existing oxide semiconductor thin film transistors, the inventor of the present application found in research: due to the different materials of the oxide semiconductor and the insulating layer, there will be interface effects at the interface, and for instance, the covalent bond between atoms is broken here, thus free electrons or traps are easily formed, that is, the interface defect state; however, the conductive channel of the conventional oxide semiconductor thin film transistor is formed at the aforesaid interface, and the interface defect state will affect the lighting stability of the oxide semiconductor thin film transistor and cause the carrier concentration of the oxide semiconductor to change. Generally, oxide semiconductor materials can be doped to improve the stability of oxide semiconductor thin film transistors, but the improvement effect is limited.

Figure 2:
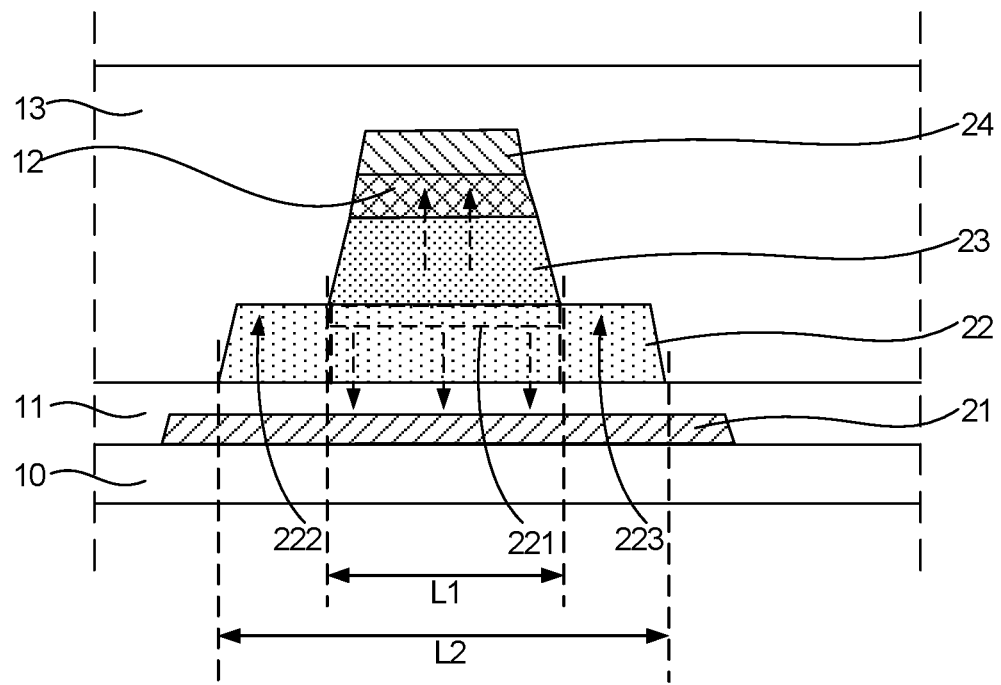
FIG. 2 is a diagram of a partial detailed structure of an array substrate provided by an embodiment of the present application.

Therefore, the present application provides an array substrate, a manufacturing method thereof and a display panel, to essentially solve the foregoing problems:

Please refer to FIG. 1 and FIG. 2. FIG. 1 is a diagram of a cross-sectional structure of an array substrate provided by an embodiment of the present application. FIG. 2 is a diagram of a partial detailed structure of an array substrate provided by an embodiment of the present application. The array substrate 100 comprises a base substrate 10 and a thin film transistor 20 disposed on the base substrate 10. The thin film transistor 20 comprises a first gate 21, a first semiconductor layer 22, a second semiconductor layer 23, a second gate 24, a source electrode 25 and a drain electrode 26 which are sequentially disposed on the base substrate 10. Certainly, the array substrate 100 further comprises a first gate insulating layer 11 positioned between the first gate 21 and the first semiconductor layer 22, a second gate insulating layer 12 positioned between the second semiconductor layer 23 and the second gate 24, an interlayer insulating layer 13 positioned between the second gate 24 and the source electrode 25, the drain electrode 26. A conductive channel 221 of the thin film transistor 20 is formed on a contact surface of the first semiconductor layer 22 and the second semiconductor layer 23.

Optionally, the base substrate 10 may be a rigid substrate or a flexible substrate; when the base substrate 10 is a rigid substrate, it may include a rigid substrate such as a glass substrate; when the base substrate 10 is a flexible substrate, it may include a flexible substrate such as a polyimide (PI) film and an ultra-thin glass film.

The first gate 21 is disposed on the base substrate 10, and a material of the first gate 21 includes metals such as copper. The first gate insulating layer 11 covers the first gate 21 and the base substrate 10. A material of the first gate insulating layer 11 comprises a combination of one or more of inorganic materials, such as silicon oxide, silicon nitride and silicon oxynitride.

The first semiconductor layer 22 is disposed on the first insulating layer 11. An orthographic projection of the first semiconductor layer 22 on the base substrate 10 is within an orthographic projection of the first gate 21 on the base substrate 10. Thus, the first gate 21 can shield the first semiconductor layer 22 to prevent light from irradiating the first semiconductor layer 22, so the first gate 21 also functions as a light shielding layer.

The second semiconductor layer 23 is disposed on the first semiconductor layer 22, and an orthographic projection of the second semiconductor layer 23 on the base substrate 10 is within an orthographic projection of the first semiconductor layer 22 on the base substrate 10, and a length L1 of the second semiconductor layer 23 is smaller than a length L2 of the first semiconductor layer 22. Thus, a size of the first semiconductor layer 22 is larger than a size of the second semiconductor layer 23, that is, there is an area of the first semiconductor layer 22 that is not covered by the second semiconductor layer 23. An area of the first semiconductor layer 22 that is covered by the second semiconductor layer 23 is the conductive channel 221 of the thin film transistor 20. Both sides of the conductive channel 221 that is not covered by the second semiconductor layer 23 are a source region 222 and a drain region 223 of the thin film transistor 20. In FIG. 2, the source region 222, the drain region 223 and the conductive channel 221 are separated by dotted lines to show distinction. Besides, the source region 222 and the drain region 223 are formed by conducting conductorization to the region of the first semiconductor layer 22 that is not covered by the second semiconductor layer 23.

Besides, the material of the first semiconductor layer 22 and the material of the second semiconductor layer 23 are the same. Optionally, materials of the first semiconductor layer 22 and the second semiconductor layer 23 comprise indium gallium zinc oxide (IGZO). In the present application, the materials of the first semiconductor layer 22 and the second semiconductor layer 23 are both indium gallium zinc oxide for illustration, wherein the first semiconductor layer 22 is formed by a magnetron sputtering method implemented to sputter an indium gallium zinc oxide target material with a gallium content of a first preset value on the first gate insulating layer 11 in an atmosphere of a first preset O2/Ar ratio. The second semiconductor layer is formed by a magnetron sputtering method implemented to sputter an indium gallium zinc oxide target material with a gallium content of a second preset value on the first semiconductor layer 22 in an atmosphere of a second preset O2/Ar ratio. A value of the second preset O2/Ar ratio is greater than a value of the first preset O2/Ar ratio and the second preset value is greater than the first preset value. That is, the content of gallium in the first semiconductor layer 22 is less than the content of gallium in the second semiconductor 23, so that the formed first semiconductor layer 22 is deficient in oxygen, and the formed second semiconductor layer 23 is rich in oxygen. Thus, a carrier concentration of the first semiconductor layer 22 can be increased, and a carrier concentration of the second semiconductor layer 23 can be reduced, so that the carrier concentration of the first semiconductor layer 22 is greater than the carrier concentration of the second semiconductor layer 23.

The second gate insulating layer 12 is disposed on the second semiconductor layer 23, and the second gate insulating layer 12 is disposed corresponding to the conductive channel 221. Optionally, the material of the first gate insulating layer 11 may also comprise a combination of one or more of inorganic materials, such as silicon oxide, silicon nitride and silicon oxynitride.

The second gate 24 is disposed on the second gate insulating layer 12, and the second gate 24 is also disposed corresponding to the conductive channel 221. The material of the second gate 24 may be the same as that of the first gate 21, for instance, both are copper. Both the first gate 21 and the second gate 24 are connected to a negative voltage, so that a direction of the electric field between the first semiconductor layer 22 and the first gate 21 is directed from the first semiconductor layer 22 to the first gate 21. A direction of the electric field between the second semiconductor layer 23 and the second gate 24 is directed from the second semiconductor layer 23 to the second gate 24. Thus, the electrons are all concentrated at the interface where the first semiconductor layer 22 and the second semiconductor layer 23 are in contact, and the carrier concentration of the first semiconductor layer 22 is greater than the carrier concentration of the second semiconductor. Therefore, the conductive channel 221 is formed on a contact surface of the first semiconductor layer 22 and the second semiconductor layer 23. The direction of the electric field is represented by a dashed line with an arrow, as shown in FIG. 2.

Meanwhile, the materials of the first semiconductor layer 22 and the second semiconductor layer 23 are the same, so that the interface defect state between the first semiconductor layer 22 and the second semiconductor layer 23 is very small, which is much smaller than the interface defect state between the semiconductor layer and the insulating layer. Thus, the stability of the conductive channel 221 formed on the surface of the first semiconductor layer 22 is relatively high, and the lighting stability of the thin film transistor 20 is greatly improved.

Furthermore, the interlayer insulating layer 13 covers the second gate 24 and the first gate insulating layer 11, and the source electrode 25 and the drain electrode 26 are disposed on the interlayer insulating layer 13. A plurality of first via holes 131 is disposed in the interlayer insulating layer 13. The source electrode 25 is connected to the source region 222 through one of the first via holes 131, and the drain electrode 26 is connected to the drain region 223 through another first via hole 131.

It is understandable that for making the surface of the array substrate 100 flattened, the array substrate 100 further comprises a passivation layer 14. Certainly, a flattening layer may also be provided on the passivation layer 14. The array substrate 100 further comprises a pixel electrode 30 disposed on the passivation layer 14. The pixel electrode 30 is connected to the source electrode 25 or the drain electrode 26 through the via hole of the passivation layer 14. In this embodiment, the pixel electrode 30 and the drain electrode 26 are connected as an illustration.

Besides, for realizing that the first gate 21 and the second gate 24 are both connected to a negative voltage, in this embodiment, a bridge electrode 40 is provided to electrically connect the first gate 21 and the second gate 24, and then is connected to a negative voltage, together. Specifically, the thin film transistor 20 further comprises a bridge electrode 40, and the second gate 40 is electrically connected to the first gate 21 through the bridge electrode 40. The bridge electrode 40 and the source electrode 25 are disposed in a same layer, and the interlayer insulating layer 13 is further disposed with a second via hole 132 and a third via hole 133, and the bridge electrode 40 is connected to the second gate 24 through the second via hole 132, and is connected to the first gate 21 through the third via hole 133.

It should be noted that the "same layer arrangement" in the present application means that in the manufacturing process, the film layer formed of the same material is patterned to obtain at least two different structures, and the at least two different structures are arranged in the same layer. For instance, the bridge electrode 40 and the source electrode 25 in this embodiment are obtained by patterning the same conductive film layer, and the bridge electrode 40 and the source electrode 25 are arranged in the same layer.

In addition, the third via hole 133 penetrates the interlayer insulating layer 13 and the first gate insulating layer 11 to the first gate 21, so that the bridge electrode 40 is connected to the first gate 21 through the third via hole 133. However, the third via hole 133 does not penetrate the first semiconductor layer 22. FIG. 1 is only a cross-sectional view illustrating the film layers of the array substrate 100.

Certainly, the solution in the present application to realize that the first gate 21 and the second gate 24 are both connected to a negative voltage is not limited to this. For instance, the first gate 21 and the second gate 24 may be connected to the negative voltage, respectively. Alternately, the bridge electrode 40 may be in the same layer as the second gate 24, directly electrically connected to the second gate 24, and electrically connected to the first gate 21 through a via hole of the second gate insulating layer 12.

Figure 3:
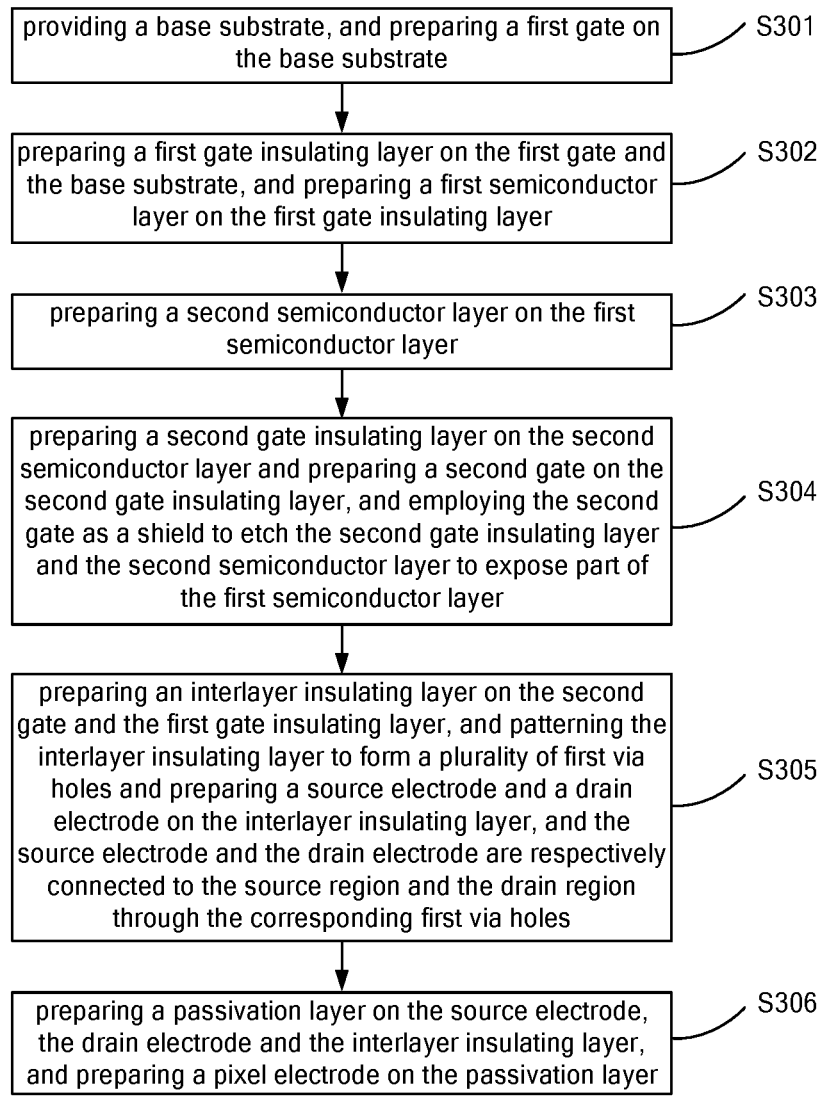
FIG. 3 is a schematic flowchart of a manufacturing method of an array substrate provided by an embodiment of the present application.
Figure 4A:
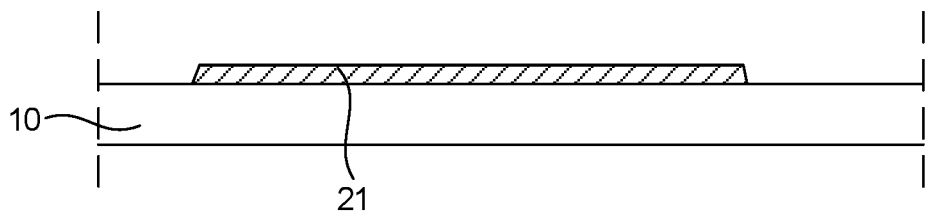
FIG. 4a to FIG. 4j are film structure diagrams of the array substrate prepared in each step of the manufacturing method of the array substrate provided by an embodiment of the present application.

In one embodiment, the present application further provides a manufacturing method of an array substrate. Please refer to FIG. 3 and FIG. 4a to FIG. 4j. FIG. 3 is a schematic flowchart of a manufacturing method of an array substrate provided by an embodiment of the present application. FIG. 4a to FIG. 4j are film structure diagrams of the an array substrate prepared in each step of the manufacturing method of the array substrate provided by an embodiment of the present application. The manufacturing method of the array substrate comprises a step of providing a base substrate, and a step of manufacturing a thin film transistor on the base substrate, wherein the step of manufacturing the thin film transistor comprises:

S301: providing a base substrate 10, and preparing a first gate 21 on the base substrate 10;
  specifically, as providing the base substrate 10, the base substrate 10 can be a rigid substrate or a flexible substrate; when the base substrate 10 is a rigid substrate, it may include a rigid substrate such as a glass substrate; when the base substrate 10 is a flexible substrate, it may include a flexible substrate such as a polyimide (PI) film and an ultra-thin glass film.
  A metal film is prepared on the base substrate 10 using metals such as copper, and the metal film is patterned to form the first gate 21, as shown in FIG. 4a. The manufactured first gate 21 also possesses a light-shielding function.

Figure 4B:
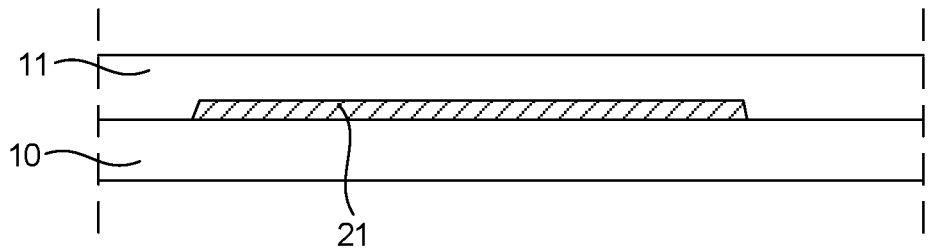
Figure 4C:
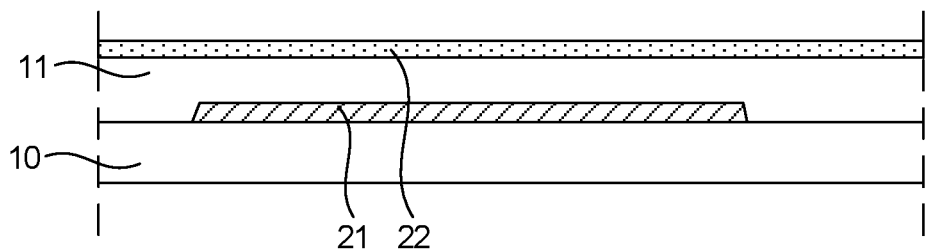

S302: preparing a first gate insulating layer 11 on the first gate 21 and the base substrate 10, and preparing a first semiconductor layer 22 on the first gate insulating layer 11;
  specifically, an inorganic thin film is prepared on the first gate 21 and the base substrate 10 as the first gate insulating layer 11, as shown in FIG. 4b. The material of the first gate insulating layer 11 comprises a combination of one or more of inorganic materials, such as silicon oxide, silicon nitride and silicon oxynitride.
  Furthermore, a magnetron sputtering method is implemented to sputter an indium gallium zinc oxide target material with a gallium content of a first preset value on the first gate insulating layer 11 to form the first semiconductor layer 22 in an atmosphere of a first preset O2/Ar ratio as shown in FIG. 4c.

Figure 4D:
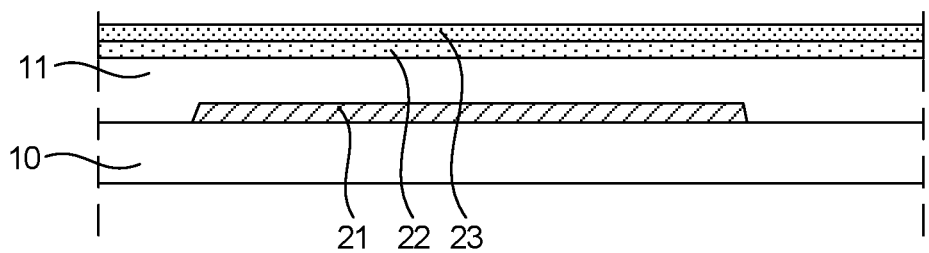

S303: preparing a second semiconductor layer 23 on the first semiconductor layer 22;
  specifically, a magnetron sputtering method is implemented to sputter an indium gallium zinc oxide target material with a gallium content of a second preset value on the first semiconductor layer 22 to form the second semiconductor layer 23 in an atmosphere of a second preset O2/Ar ratio as shown in FIG. 4d. The material of the first semiconductor layer 22 and the material of the second semiconductor layer 23 are the same. Optionally, materials of the first semiconductor layer 22 and the second semiconductor layer 23 comprise indium gallium zinc oxide. In the present application, the materials of the first semiconductor layer 22 and the second semiconductor layer 23 are both indium gallium zinc oxide for illustration.

A value of the second preset O2/Ar ratio is greater than a value of the first preset O2/Ar ratio and the second preset value is greater than the first preset value. That is, the content of gallium in the first semiconductor layer 22 is less than the content of gallium in the second semiconductor 23, so that the formed first semiconductor layer 22 is deficient in oxygen, and the formed second semiconductor layer 23 is rich in oxygen. Thus, a carrier concentration of the first semiconductor layer 22 can be increased, and a carrier concentration of the second semiconductor layer 23 can be reduced, so that the carrier concentration of the first semiconductor layer 22 is greater than the carrier concentration of the second semiconductor layer 23.

Figure 4E:
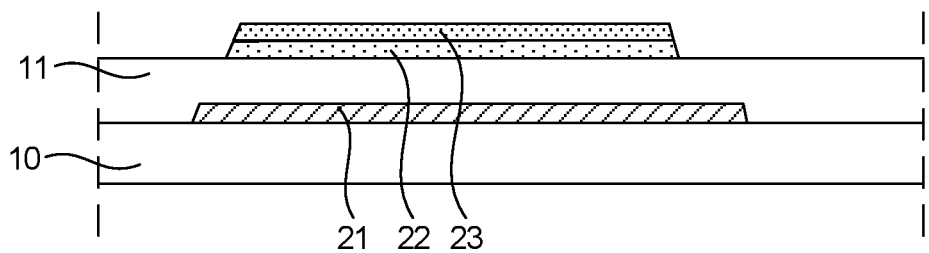

Furthermore, the first semiconductor layer 22 and the second semiconductor layer 23 are patterned, as shown in FIG. 4e. An orthographic projection of the first semiconductor layer 22 on the base substrate 10 is within an orthographic projection of the first gate 21 on the base substrate 10, so that the first gate 21 can shield the first semiconductor layer 22.

Figure 4F:
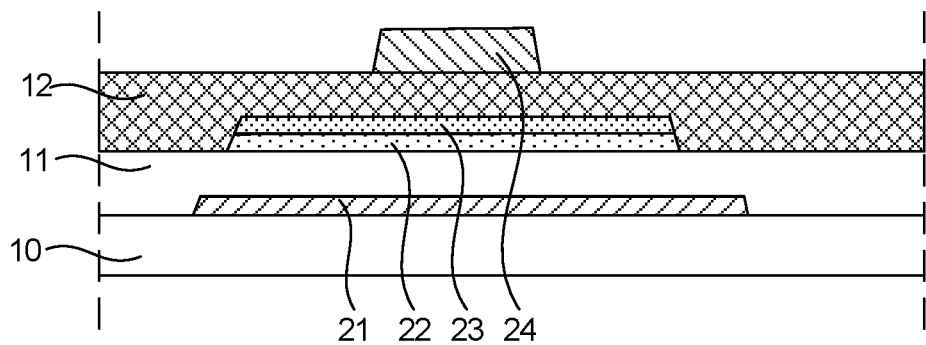

S304: preparing a second gate insulating layer 12 on the second semiconductor layer 23 and preparing a second gate 24 on the second gate insulating layer 12, and employing the second gate 24 as a shield to etch the second gate insulating layer 12 and the second semiconductor layer 23 to expose part of the first semiconductor layer 22, wherein a conductive channel 221 of the thin film transistor 20 is formed on a contact surface of the first semiconductor layer 22 and the second semiconductor layer 23, and the first semiconductor layers 22 located on both sides of the conductive channel 221 form a source region 222 and a drain region 223 of the thin film transistor 20;

Specifically, an inorganic thin film is prepared on the second semiconductor layer 23 and the first gate insulating layer 11 as the second gate insulating layer 12. A material of the second gate insulating layer 12 comprises a combination of one or more of inorganic materials, such as silicon oxide, silicon nitride and silicon oxynitride. Then, a metal film made of metal such as copper is prepared on the second gate insulating layer 12, and the metal film is patterned to form the second gate 24, as shown in FIG. 4f.

Figure 4G:
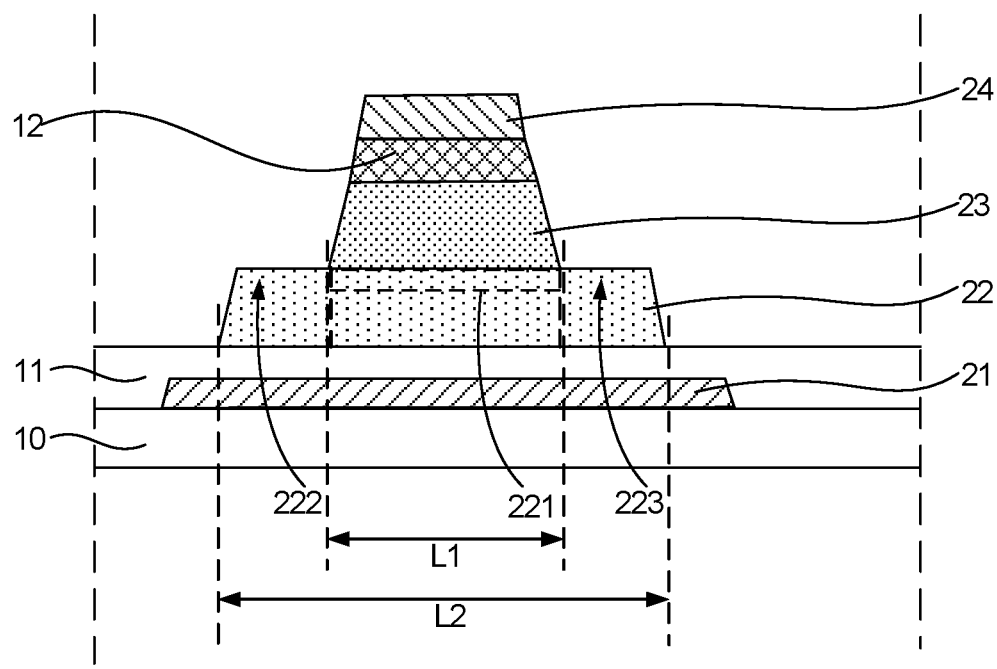

With the second gate 24 as a shield, the second gate insulating layer 12 and the second semiconductor layer 23 are etched using a self-aligned process to expose part of the first semiconductor layer 22, as shown in FIG. 4g. An orthographic projection of the second semiconductor layer 23 on the base substrate 10 is within an orthographic projection of the first semiconductor layer 22 on the base substrate 10, and a length L1 of the second semiconductor layer 23 is smaller than a length L2 of the first semiconductor layer 22. Thus, a size of the first semiconductor layer 22 is larger than a size of the second semiconductor layer 23, that is, there is an area of the first semiconductor layer 22 that is not covered by the second semiconductor layer 23. The conductive channel 221 of the thin film transistor 20 is formed on a contact surface of the first semiconductor layer 22 and the second semiconductor layer 23. Moreover, conductorization is conducted to the region of the first semiconductor layer 22 that is on both sides of the conductive channel 221 and is not covered by the second semiconductor layer 23 to form the source region 222 and the drain region 223 of the thin film transistor 20.

S305: preparing an interlayer insulating layer 13 on the second gate 24 and the first gate insulating layer 11, and patterning the interlayer insulating layer 13 to form a plurality of first via holes 131 and preparing a source electrode 25 and a drain electrode 26 on the interlayer insulating layer 13, and the source electrode 25 and the drain electrode 26 are respectively connected to the source region 222 and the drain region 223 through the corresponding first via holes 131.

Figure 4H:
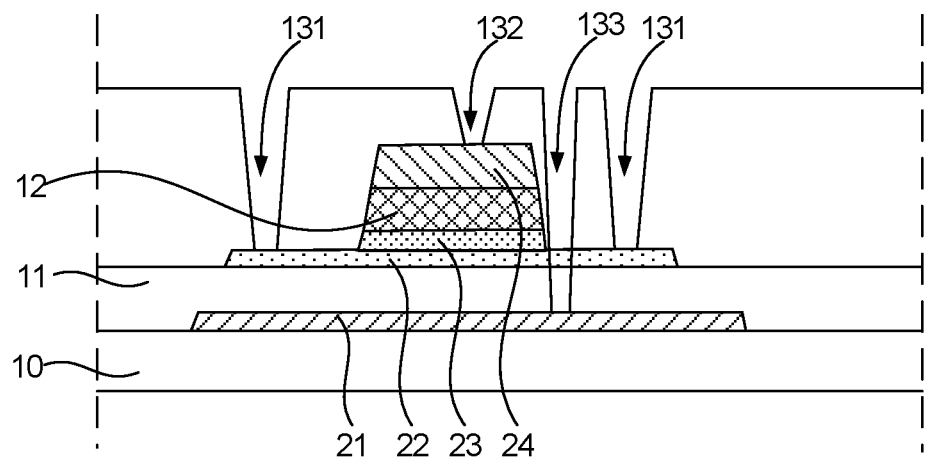

Specifically, the interlayer insulating layer 13 is prepared on the second gate 24 and the first gate insulating layer 11, and the interlayer insulating layer 13 is patterned to form a plurality of first via holes 131, second via holes 132 and third via holes 133, as shown in FIG. 4h.

Figure 4I:
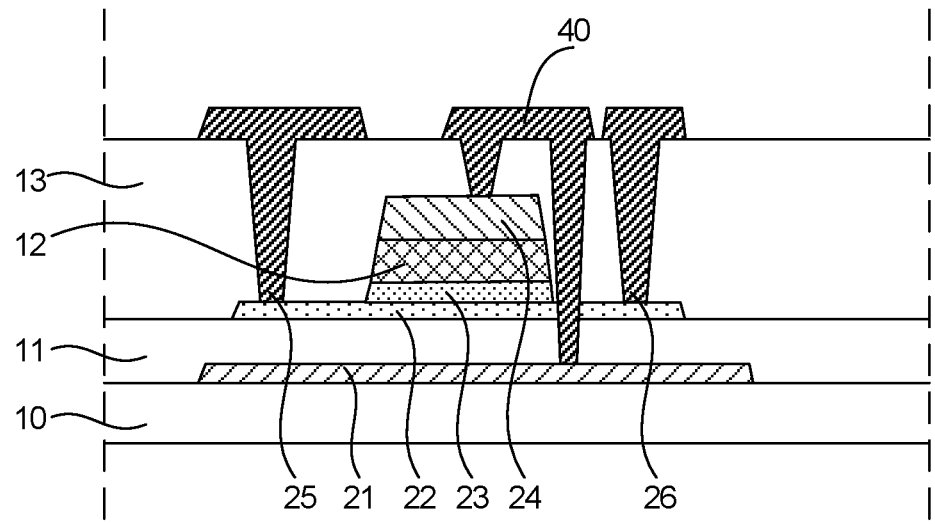

Furthermore, a metal thin film of copper or other metals is prepared on the interlayer insulating layer 13, and the metal thin film is patterned to form the source electrode 25, the drain electrode 26 and the bridge electrode 40. As shown in FIG. 4i, the source electrode 25 is connected to the source region 222 through one of the first via holes 131, and the drain electrode 26 is connected to the drain region 223 through another first via hole. The bridge electrode 40 is connected to the second gate 24 through the second via hole 132, and is connected to the first gate 21 through the third via hole 133, so as to realize the electrical connection between the first gate 21 and the second gate 24. Both the first gate 21 and the second gate 24 are connected to a negative voltage, so that a direction of the electric field between the first semiconductor layer 22 and the first gate 21 is directed from the first semiconductor layer 22 to the first gate 21. A direction of the electric field between the second semiconductor layer 23 and the second gate 24 is directed from the second semiconductor layer 23 to the second gate 24. Thus, the electrons are all concentrated at the interface where the first semiconductor layer 22 and the second semiconductor layer 23 are in contact, and the carrier concentration of the first semiconductor layer 22 is greater than the carrier concentration of the second semiconductor. Therefore, the conductive channel 221 is formed on a contact surface of the first semiconductor layer 22 and the second semiconductor layer 23.

Meanwhile, the materials of the first semiconductor layer 22 and the second semiconductor layer 23 are the same, so that the interface defect state between the first semiconductor layer 22 and the second semiconductor layer 23 is very small, which is much smaller than the interface defect state between the semiconductor layer and the insulating layer. Thus, the stability of the conductive channel 221 formed on the surface of the first semiconductor layer 22 is relatively high, and the lighting stability of the thin film transistor 20 is greatly improved.

S306: preparing a passivation layer 14 on the source electrode 25, the drain electrode 26 and the interlayer insulating layer 13, and preparing a pixel electrode 30 on the passivation layer 14.

Specifically, the passivation layer 14 is prepared on the source electrode 25, the drain electrode 26 and the interlayer insulating layer 13, and the passivation layer 14 is patterned to form a via hole to expose the source electrode 25 or the drain electrode 26. In this embodiment, the drain electrode 26 is exposed as an illustration.

Figure 4J:
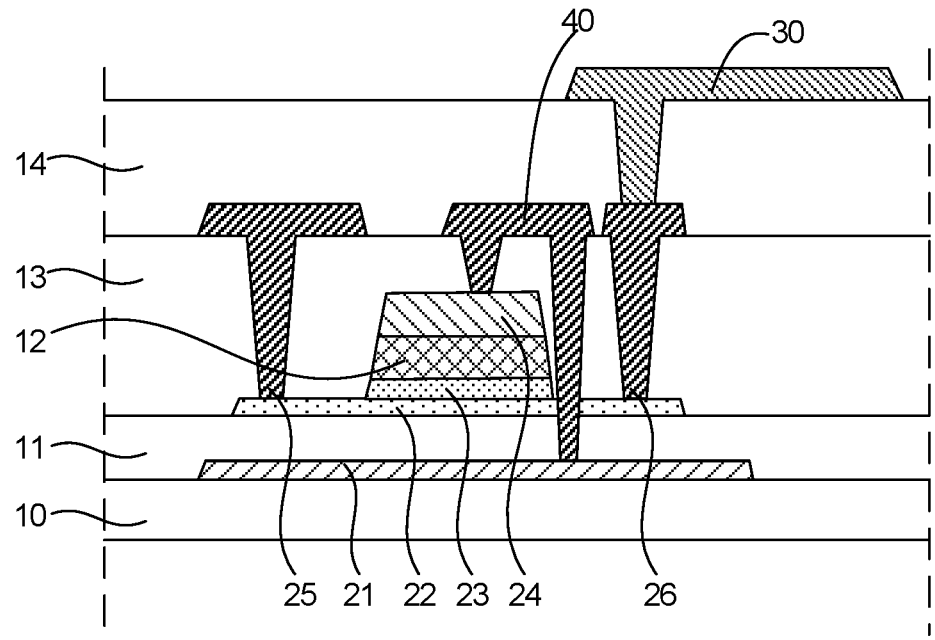

Furthermore, the pixel electrode 30 is prepared on the passivation layer 14. The pixel electrode 30 is connected to the drain electrode 26 through the via hole of the passivation layer 14, as shown in FIG. 4j.

In one embodiment, the present application further provides a display panel. The display panel comprises the array substrate 100 of one of the foregoing embodiments. Optionally, the display panel comprises an OLED display panel, a liquid crystal display panel, a QLED display panel, a QD-OLED display panel and the like. When the display panel is an OLED display panel, the display panel further comprises a light emitting function layer, an encapsulation layer, etc., disposed on the array substrate 100.

When the display panel is a liquid crystal display panel, the display panel further comprises a color filter substrate disposed opposite to the array substrate, liquid crystal molecules disposed between the array substrate and the color filter substrate, a backlight module disposed on the side of the array substrate away from the color filter substrate, a lower polarizer disposed between the backlight module and the array substrate and an upper polarizer disposed on the side of the color filter substrate away from the array substrate. Certainly, when the display panel is to implement functions such as touch control, the display panel may also comprise structures, such as a touch control layer, which will not be repeated here.

It can be known according to the aforesaid embodiment: the present application provides an array substrate, a manufacturing method thereof and a display panel. The array substrate comprises a base substrate and a thin film transistor disposed on the base substrate, and the thin film transistor comprises a first gate, a first semiconductor layer, a second semiconductor layer, a second gate, a source electrode and a drain electrode which are sequentially disposed on the base substrate, wherein a conductive channel of the thin film transistor is formed on a contact surface of the first semiconductor layer and the second semiconductor layer. In the present application, the conductive channel is formed between semiconductor layers of the same material. It can avoid the interface defect state caused by the material difference when the existing conductive channel is formed on the side of the semiconductor layer close to the insulating layer, thereby solving the problem of poor lighting stability in the existing oxide semiconductor thin film transistor.

In the foregoing embodiments, the description of the various embodiments have respective different emphases, and a part in some embodiment, which is not described in detail can be referred to the related description of other embodiments.

The embodiment of the present application is described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

What is claimed is:

1. An array substrate, comprising a base substrate and a thin film transistor disposed on the base substrate, and the thin film transistor comprises a first gate, a first semiconductor layer, a second semiconductor layer, a second gate, a source electrode and a drain electrode which are sequentially disposed on the base substrate, wherein a conductive channel of the thin film transistor is formed on a contact surface of the first semiconductor layer and the second semiconductor layer; and wherein a carrier concentration of the first semiconductor layer is greater than a carrier concentration of the second semiconductor layer.

2. The array substrate according to claim 1, wherein materials of the first semiconductor layer and the second semiconductor layer comprise indium gallium zinc oxide.

3. The array substrate according to claim 2, wherein a content of gallium in the first semiconductor layer is less than a content of gallium in the second semiconductor layer.

4. The array substrate according to claim 1, wherein both the first gate and the second gate are connected to a negative voltage.

5. The array substrate according to claim 4, further comprising:
   a first gate insulating layer, covering the first gate and the base substrate, and the first semiconductor layer is disposed on the first insulating layer and the second semiconductor layer is disposed on the first semiconductor layer, and an orthographic projection of the second semiconductor layer on the base substrate is within an orthographic projection of the first semiconductor layer on the base substrate;
   a second gate insulating layer, covering the second semiconductor layer, and the second gate is disposed on the second insulating layer, and the second gate is disposed corresponding to the conductive channel;
   an interlayer insulating layer, covering the second gate and the first gate insulating layer, and the source electrode and the drain electrode are disposed on the interlayer insulating layer, and a plurality of first via holes are disposed in the interlayer insulating layer;
   wherein the first semiconductor layers located on both sides of the conductive channel form a source region and a drain region of the thin film transistor, and the source electrode and the drain electrode are respectively connected to the source region and the drain region through the corresponding first via holes.

6. The array substrate according to claim 5, wherein the thin film transistor further comprises a bridge electrode, and the second gate is electrically connected to the first gate through the bridge electrode.

7. The array substrate according to claim 6, wherein the bridge electrode and the source electrode are disposed in a same layer, and the interlayer insulating layer is further disposed with a second via hole and a third via hole, and the bridge electrode is connected to the second gate through the second via hole, and is connected to the first gate through the third via hole.

8. The array substrate according to claim 5, wherein the orthographic projection of the first semiconductor layer on the base substrate is within an orthographic projection of the first gate on the base substrate.

9. The array substrate according to claim 5, wherein a length of the second semiconductor layer is smaller than a length of the first semiconductor layer.

10. A display panel, comprising an array substrate, and the array substrate comprises a base substrate and a thin film transistor disposed on the base substrate, and the thin film transistor comprises a first gate, a first semiconductor layer, a second semiconductor layer, a second gate, a source electrode and a drain electrode which are sequentially disposed on the base substrate, wherein a conductive channel of the thin film transistor is formed on a contact surface of the first semiconductor layer and the second semiconductor layer; and wherein a carrier concentration of the first semiconductor layer is greater than a carrier concentration of the second semiconductor layer.

11. The display panel according to claim 10, wherein materials of the first semiconductor layer and the second semiconductor layer comprise indium gallium zinc oxide.

12. The display panel according to claim 11, wherein a content of gallium in the first semiconductor layer is less than a content of gallium in the second semiconductor layer.

13. The display panel according to claim 10, wherein both the first gate and the second gate are connected to a negative voltage.

14. The display panel according to claim 10, wherein a length of the second semiconductor layer is smaller than a length of the first semiconductor layer.

15. A manufacturing method of an array substrate, comprising a step of providing a base substrate, and a step of manufacturing a thin film transistor on the base substrate, wherein the step of manufacturing the thin film transistor comprises:
   preparing a first gate on the base substrate;
   preparing a first gate insulating layer on the first gate and the base substrate, and preparing a first semiconductor layer on the first gate insulating layer;
   preparing a second semiconductor layer on the first semiconductor layer;
   preparing a second gate insulating layer on the second semiconductor layer and preparing a second gate on the second gate insulating layer, and employing the second gate as a shield to etch the second gate insulating layer and the second semiconductor layer to expose part of the first semiconductor layer, wherein a conductive channel of the thin film transistor is formed on a contact surface of the first semiconductor layer and the second semiconductor layer, and the first semiconductor layers located on both sides of the conductive channel form a source region and a drain region of the thin film transistor;
   preparing an interlayer insulating layer on the second gate and the first gate insulating layer, and patterning the interlayer insulating layer to form a plurality of first via holes and preparing a source electrode and a drain electrode on the interlayer insulating layer, and the source electrode and the drain electrode are respectively connected to the source region and the drain region through the corresponding first via holes.

16. The manufacturing method of the array substrate according to claim 15, wherein the step of preparing the first semiconductor layer on the first gate insulating layer comprises:

implementing a magnetron sputtering method to sputter an indium gallium zinc oxide target material with a gallium content of a first preset value on the first gate insulating layer to form the first semiconductor layer in an atmosphere of a first preset O2/Ar ratio.

17. The manufacturing method of the array substrate according to claim 16, wherein the step of preparing the second semiconductor layer on the first semiconductor layer comprises:

implementing a magnetron sputtering method to sputter an indium gallium zinc oxide target material with a gallium content of a second preset value on the first semiconductor layer to form the second semiconductor layer in an atmosphere of a second preset O2/Ar ratio, wherein a value of the second preset O2/Ar ratio is greater than a value of the first preset O2/Ar ratio and the second preset value is greater than the first preset value, so that a carrier concentration of the first semiconductor layer is greater than a carrier concentration of the second semiconductor layer.

18. The manufacturing method of the array substrate according to claim 15, wherein the manufacturing method further comprises:

the step of patterning the interlayer insulating layer further forms a second via hole and a third via hole, and while forming the source electrode and the drain electrode on the interlayer insulating layer, a bridge electrode is further formed, and the bridge electrode is connected to the second gate through the second via hole, and is connected to the first gate through the third via hole, so that both the first gate and the second gate are connected to a negative voltage.

* * * * *